(12) United States Patent
Kawahara (10) Patent No.: US 8,609,465 B2
(45) Date of Patent: Dec. 17, 2013

(54) SEMICONDUCTOR DEVICE MANUFACTURING METHOD

(75) Inventor: Nakaya Kawahara, Toyota (JP)

(73) Assignee: Toyota Jidosha Kabushiki Kaisha, Toyota (JP)

(*) Notice: Subject to any disclaimer, the term of this patent is extended or adjusted under 35 U.S.C. 154(b) by 99 days.

(21) Appl. No.: 13/376,523

(22) PCT Filed: Oct. 9, 2009

(86) PCT No.: PCT/JP2009/067620
§ 371 (c)(1),
(2), (4) Date: Dec. 6, 2011

(87) PCT Pub. No.: WO2011/042982
PCT Pub. Date: Apr. 14, 2011

(65) Prior Publication Data
US 2012/0231584 A1    Sep. 13, 2012

(51) Int. Cl.
*H01L 21/00* (2006.01)
(52) U.S. Cl.
USPC .......................................................... 438/113
(58) Field of Classification Search
None
See application file for complete search history.

(56) References Cited

U.S. PATENT DOCUMENTS

| 6,429,508 B1* | 8/2002 | Gang | 257/678 |
| 7,679,172 B2* | 3/2010 | Huang et al. | 257/678 |
| 7,902,649 B2* | 3/2011 | Lin et al. | 257/676 |
| 2004/0097081 A1 | 5/2004 | Igarashi et al. | |
| 2006/0214295 A1 | 9/2006 | Tanaka et al. | |

FOREIGN PATENT DOCUMENTS

| JP | A-2000-31314 | 1/2000 |
| JP | A-2000-252392 | 9/2000 |
| JP | A-2003-258153 | 9/2003 |
| JP | A-2004-119726 | 4/2004 |
| JP | A-2006-93679 | 4/2006 |
| JP | A-2006-269966 | 10/2006 |

OTHER PUBLICATIONS

International Search Report issued in International Application No. PCT/JP2009/067620 dated Nov. 2, 2009 (with translation).

* cited by examiner

*Primary Examiner* — Charles Garber
*Assistant Examiner* — Andre' C Stevenson
(74) *Attorney, Agent, or Firm* — Oliff & Berridge, PLC (57) ABSTRACT

A method for manufacturing a semiconductor device includes: a step of producing a semiconductor package intermediate by injecting a resin into a forming die in which electrodes, a heat dissipating pad, and a semiconductor element are disposed, providing a peel-off film on one side of the resin in the form of a still-uncured resin body opposite from the other side facing the heat dissipating pad and a rigid material on one side of the peel-off film, and curing the uncured resin body to form a sealant resin body; a step of forming a solder layer by reflow soldering between a substrate and the intermediate; and a step of removing the rigid material from the peel-off film, wherein the rigid material is integrated into the intermediate so as to make the thermal expansion coefficient and rigidity of the intermediate approximately equal to those of the substrate.

8 Claims, 5 Drawing Sheets

SEMICONDUCTOR DEVICE MANUFACTURING METHOD

TECHNICAL FIELD

The present invention relates to a method for manufacturing a semiconductor device by joining a semiconductor package and a substrate via a solder layer.

BACKGROUND ART

Along with the development of smaller, multifunctional, high-performance electronic devices in recent years, demands have emerged for advanced high-density packaging of semiconductor parts. An important technical challenge in the art is finding a way to realize a downsized (thinned) semiconductor package having improved heat dissipation capacity. Examples of such semiconductor package types include the CSP (Chip Size Package), the BGA (Ball Grid Array) package, the LGA (Land Grid Array) package, the MCP (Multi Chip Package), and the SiP (System in Package).

Regarding semiconductor package downsizing (thinning), there is a leadless-type semiconductor package available on the market that is obtained by partially exposing electrode terminals on the package bottom or side faces without sealing the electrode terminals inside a resin so as not to expose lead wires.

In addition, regarding the heat dissipation capacity of a semiconductor package, there is a semiconductor package available on the market that has a structure in which a die pad (heat dissipating pad) that functions as a radiator plate is partially exposed and is not sealed inside a resin or a structure in which a built-in radiator plate prepared as a separate body is provided.

A semiconductor package having a structure in which a heat dissipating pad is entirely or partially exposed outside a sealant resin body is relatively superior in terms of heat dissipation capacity to a semiconductor package having a built-in radiator plate prepared as a separate body. Therefore, such semiconductor package is preferably used in a case in which a semiconductor element that generates a large amount of heat is installed.

Figure 7:
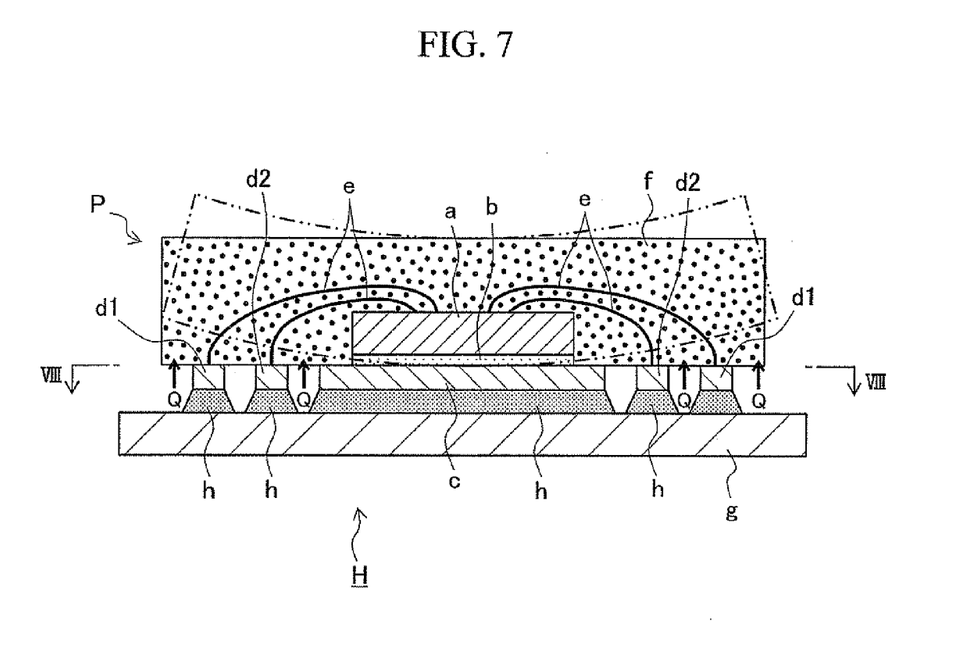
FIG. 7 shows a longitudinal sectional view of a conventional semiconductor device, which illustrates a thermal deformation mode of a semiconductor package and application of tensile force to a solder layer in such thermal deformation mode.
Figure 8:
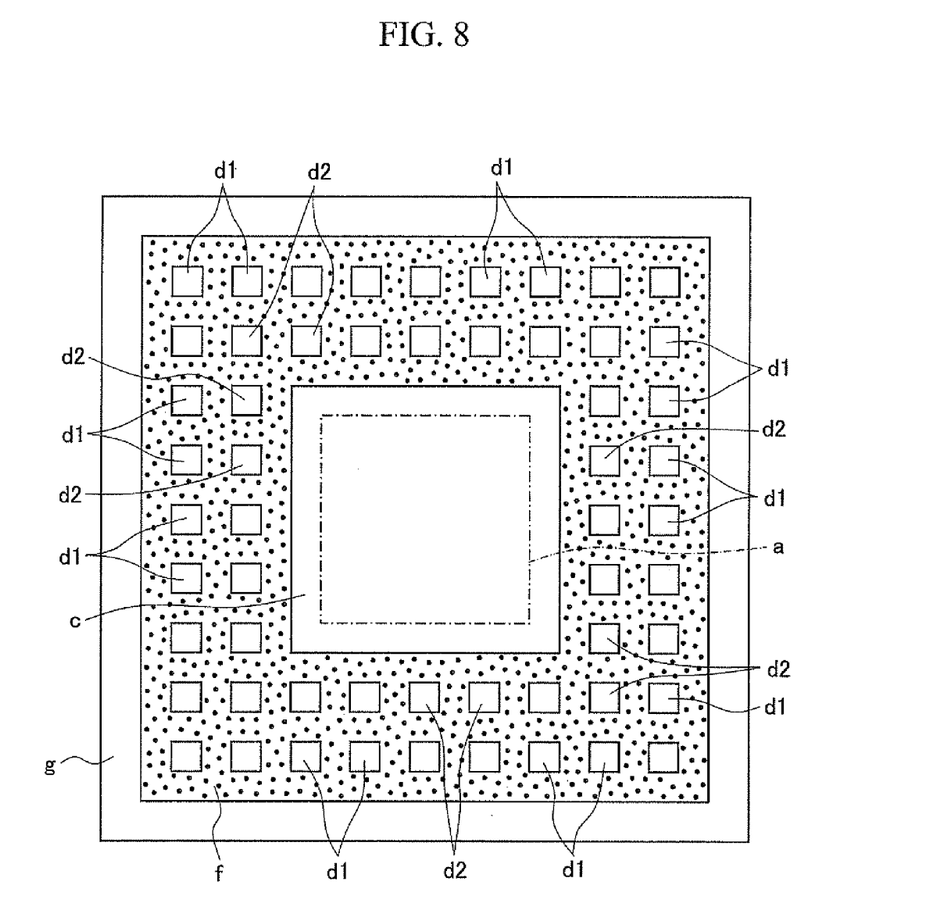
FIG. 8 is a VIII-VIII fragmentary view of FIG. 7.

Each of FIGS. 7 and 8 shows an example of a semiconductor device, in which the aforementioned leadless-type semiconductor package is mounted on a substrate, such semiconductor package having a structure in which a heat dissipating pad is partially or entirely exposed. In addition, each example shows a semiconductor device in which a heat dissipating pad is entirely exposed outside a sealant resin body; that is to say, a heat dissipating pad is completely exposed on one side of the sealant resin body facing the substrate. FIG. 7 shows a longitudinal sectional view of such device. FIG. 8 shows a VIII-VIII fragmentary view of FIG. 7.

In FIGS. 7 and 8, a semiconductor element "a" is mounted on a heat dissipating pad "c" via joining using a die-bonding material "b" such as an electrically conductive adhesive so as to achieve electrical connection to electrodes d1 and d2 (outermost circumference side: d1) with leads "e." Further, the heat dissipating pad "c" and the electrodes "d1 and d2" are disposed on the lower face of a sealant resin body "f" that seals the semiconductor element "a" (provided that an electrode or a heat dissipating pad may be partially embedded in a sealant resin body). Thus a semiconductor package "P" is formed. The heat dissipating pad "c" and the electrodes "d1 and d2" of the semiconductor package "P" are joined to a substrate "g" via a solder layer "h," and thus a semiconductor device "H" is formed.

As an aside, in a case of a conventional semiconductor device "H" shown in FIG. 7 or 8, a package "P" and a substrate "g" are heated during reflow soldering in a step of joining a heat dissipating pad "c" and electrodes "d1 and d2" to the substrate "g" via reflow soldering. This results in vaporization and expansion of moisture absorbed in the package "P" during the period from assembly to mounting. This information is publicly known.

In general, the rigidity of a substrate "g" is relatively higher than that of a semiconductor package "P." In addition, the thermal expansion coefficient of the substrate "g" is relatively lower than that of the semiconductor package "P" (and therefore the semiconductor package "P" is unlikely to experience thermal deformation). This information is publicly known.

Therefore, upon reflow soldering described above, the substrate "g" has a high degree of rigidity and a low thermal expansion amount, while on the other hand, the semiconductor package "P" has a relatively low degree of rigidity and a relatively high thermal expansion amount. Therefore, for example, a deformation mode of the semiconductor package "P" is observed in which the area of the semiconductor element "a" projects toward the substrate "g," and portions in the vicinity of electrodes "d1 and d2" located at a distance from the area of the semiconductor element "a" roll back against the substrate "g." For example, as in the example shown in FIG. 7, when a semiconductor package "P" has a structure in which a semiconductor element "a" is disposed at the center position and electrodes "d1 and d2" are disposed on the outer circumference side of the semiconductor element "a," a deformation mode of the semiconductor package "P" is observed in which the edge portions including the electrodes "d1 and d2" of the semiconductor package "P" rolls back against the substrate "g" (indicated with a single-dot chain line in FIG. 7).

As a result, when the electrodes "d1 and d2" disposed on the outer circumference side of the semiconductor package "P" are joined to the substrate "g," shear force or tensile force "Q" is applied to a solder layer "h," which is a constituent member of the semiconductor package "P" and corresponds to a strucuturally weak portion of the semiconductor package "P," easily causing detachment or crack formation. This has been probelamtic. Also, detachment of the semiconductor element "a" from the heat dissipating pad "c" due to excessive deformation of the semiconductor package "P," detachment of the heat dissipating pad "c" from the sealant resin body "f," and crack formation in the sealant resin body "f" have been problematic. It is an urgent task in the art to solve such problems.

Here, disclosed conventional techniques are intended to prevent warpage of a semiconductor package and destruction of constituent members of a semiconductor device caused by warpage described above. For such purpose, Patent Document 1 discloses a semiconductor package in which a radiator plate is provided at the center of the thickness of a semiconductor device, and a semiconductor element, a mold resin, and an interposer substrate are provided below and above the radiator plate, resulting in line-symmetric arrangement along the line passing through the center of the thickness.

In addition, the thermal expansion coefficient of the semiconductor package is obtained using the two interposer substrates that constitute the semiconductor package. Eventually, the thermal expansion coefficient of a mounted substrate upon which the semiconductor package is joined via reflow soldering is made approximately equal to that of the semiconductor package so as to reduce differences in the amount of displacement between the semiconductor package and the mounted substrate.

However, it can be easily predicted that it will be difficult to manufacture a semiconductor package with a line-symmetric configuration along the line passing through the center of the thickness, and manufacturing of such semiconductor package will result in higher costs. In addition, from a practical standpoint, it must be said that the general versatility of such vertically or horizontally symmetric semiconductor package is low. Therefore, it is difficult to say that the use of such semiconductor package is a practical and effective way to solve the above problems in the art.

Patent Document 1: JP Patent Publication (Kokai) No. 2006-93679 A

SUMMARY OF INVENTION

Technical Problem

The present invention has been made in view of the above problems. An object of the present invention is to provide a semiconductor device manufacturing method by improving a manufacturing process for manufacturing a semiconductor device which comprises joining a semiconductor package to a substrate via reflow soldering without modifying the structure of the semiconductor package in a specific manner. By such method, it becomes possible to effectively prevent relatively significant warpage or deformation of a semiconductor package or a substrate caused by differences in the rigidity and thermal expansion coefficient therebetween and damage to a solder layer or the like resulting from such warpage or deformation.

Solution to Problem

In order to achieve the above object, the semiconductor device manufacturing method of the present invention is described as a method for manufacturing a semiconductor device by forming a semiconductor package with a heat dissipating pad, a semiconductor element mounted on the heat dissipating pad, electrodes disposed at a distance from the heat dissipating pad and electrically connected to the semiconductor element, and a sealant resin body for sealing at least the semiconductor element and joining the heat dissipating pad and the electrodes separately to a substrate via a solder layer, which comprises:

a first step of producing a semiconductor package intermediate by injecting a resin used for the sealant resin body into a forming die in which the electrodes, the heat dissipating pad, and the semiconductor element are disposed, providing a peel-off film on one side of the resin in the form of a still-uncured resin body opposite from the other side facing the heat dissipating pad and a rigid material on one side of the peel-off film opposite from the other side facing the uncured resin body, and curing the uncured resin body to form the sealant resin body;

a second step of forming the solder layer by reflow soldering between the substrate and each of the heat dissipating pad and the electrodes that constitute the semiconductor package intermediate removed from the forming die in the first step; and a third step of removing the rigid material from the peel-off film, and wherein the rigid material is integrated into the semiconductor package intermediate so as to make the thermal expansion coefficient and rigidity of the semiconductor package intermediate approximately equal to those of the substrate.

The manufacturing method of the present invention is mainly intended to inhibit or prevent warpage of a semiconductor package and detachment, crack formation, or the like resulting from such warpage in a high-temperature atmosphere upon reflow soldering of, in particular, a semiconductor package and a substrate (circuit substrate) in the manufacturing process. Warpage of the semiconductor package is caused by differences between a semiconductor package and a substrate in terms of the rigidity and the thermal expansion coefficient. (For example, in a deformation mode of a semiconductor package, if a semiconductor element is disposed at the center of a semiconductor package, the center area projects toward a substrate and the edge portions including disposed electrodes of the semiconductor package roll back against the substrate.) Detachment, crack formation, or the like tends to occur particularly in a solder layer via which the electrodes in the edge portions are joined to the substrate.

Hence, in order to realize the relevant structural configuration for the manufacturing method, a rigid material which is used to improve the rigidity of the entire semiconductor package is temporarily attached to one side of a sealant resin body (in the form of a still-uncured resin body) constituting the semiconductor package, which is opposite from the side facing the substrate, in the first step (that is to say, the step of producing a semiconductor package).

In the semiconductor package, a semiconductor element is sealed with a sealant resin body consisting of an appropriate resin. A heat dissipating pad and electrodes (external electrodes) are disposed on one side of the sealant resin body (or they may be partially embedded in the sealant resin body). In general, such sealant resin body accounts for most of the volume of the semiconductor package. Therefore, the thermal expansion coefficient and rigidity of the entire semiconductor package depend to a significant degree on the thermal expansion coefficient and rigidity of the sealant resin body.

For example, if the sealant resin body consists of an epoxy resin, the thermal expansion coefficient is approximately 60 ppm/K and the Young's modulus, which is a determinant of rigidity, is approximately 3 to 4 GPa.

Meanwhile, if a substrate consists of a glass epoxy resin, the thermal expansion coefficient thereof is approximately 10 ppm/K and the Young's modulus thereof is approximately 20 GPa. Accordingly, the rigidity of the substrate can be significantly higher than that of the semiconductor package while the thermal deformation amount thereof can be significantly lower than that of the same. It can be said that this phenomenon tends to be observed in general, although the degrees of such differences therebetween would vary depending on type of starting materials. Therefore, the above deformation mode observed in the reflow soldering step and the subsequent detachment of or crack formation in a solder layer can be regarded as general problems.

When the deformation mode of a member is specified based on the thermal expansion coefficient and flexible rigidity of the member, not only Young's modulus but also sectional rigidity (e.g., sectional secondary moment) can be determinants of flexible rigidity. Thus, needless to say, flexible rigidity is influenced by the sectional shape or size of a member.

Therefore, according to the manufacturing method of the present invention, a rigid material is temporarily attached to one side of a resin used for a sealant resin body that is opposite from the other side facing a heat dissipating pad (i.e., the side opposite from the side facing a substrate on which the sealant resin body is joined to a substrate via a solder layer in the subsequent step) so as to impart rigidity to the entire semiconductor package and decrease the thermal deformation amount of the entire semiconductor package in a phase in which the resin is in the form of a still-uncured resin body during the process for manufacturing a semiconductor package. Specifically, the process comprises forming a sealant resin body that is used to integrate a semiconductor element, a heat dissipating pad on which the semiconductor element is mounted, and electrodes that are electrically connected to the semiconductor element. The phrase "decrease the thermal deformation amount of the entire semiconductor package" used herein means to decrease the thermal deformation amount of the entire semiconductor package by, for example, selecting a rigid material having a higher degree of rigidity and a lower thermal expansion coefficient than a sealant resin body as a constituent of a semiconductor package intermediate so as to allow the rigid material to inhibit the deformation of a sealant resin body that is deformed to a relatively greater extent in a high-temperature atmosphere.

For example, such rigid material can be formed with a material having a degree of rigidity (or Young's modulus) and a thermal expansion coefficient comparable to those of a substrate or a material used for a substrate. Further, it may be formed with a material having a thermal expansion coefficient comparable to that of a substrate or a material having a higher degree of rigidity (or Young's modulus) than a substrate. However, such rigid material is not particularly limited in terms of starting material, size, sectional shape, or plane shape as long as the following conditions are satisfied. The thermal deformation amount of a semiconductor package intermediate comprising a rigid material and that of a substrate can be made approximately equal to each other in a high-temperature atmosphere upon reflow soldering. In addition, the rigidity and the thermal deformation amount of the entire semiconductor package intermediate can be adjusted so as not to cause damage to a solder layer interposed between the semiconductor package intermediate and the substrate due to tensile force acting on either the semiconductor package intermediate or the substrate as a result of relatively significant thermal deformation of the other.

The phrase "to make the thermal expansion coefficient and rigidity of the semiconductor package intermediate approximately equal to those of the substrate" used in the above means that the thermal expansion coefficient and rigidity of the former are made identical or substantially identical to those of the latter. When such substantially identical levels of the thermal expansion coefficient and rigidity can be achieved, it means that the thermal expansion coefficient and rigidity of the entire semiconductor package are made approximately equal to those of the substrate so as to inhibit thermal deformation of the semiconductor package to such an extent that no detachment, crack formation, cleavage, or the like takes place in a solder layer, which is a structurally fragile part of a semiconductor device.

Then, a solder layer is formed in the second step. Subsequently, the above rigid material is removed from a peel-off film in the third step. Accordingly, a semiconductor package is formed and thus a semiconductor device is manufactured.

Here, a peel-off film is provided to an uncured resin body and then a rigid material is disposed on the uncured resin body via the peel-off film. This ensures easy removal of the rigid material from a cured sealant resin body.

In addition, such peel-off film is formed with film, tape, a sheet, or the like made of a resin material that is detachable from a rigid material or a resin material having excellent detachability. Examples thereof include a fluorine resin, polyester, polypropylene, polyamide, polyamideimide, and any of such examples surface-coated with a fluorine resin.

In some cases, a peel-off film may be formed with a resin that is the same material as used for a sealant resin body. In such case, a peel-off film is allowed to easily conform thermal deformation of a sealant resin body. Therefore, for example, breakage of a thin-layer peel-off film due to thermal deformation of a sealant resin body can be effectively inhibited upon reflow soldering.

Further, an example of a rigid material that may be used is a rigid material that can be formed so as to have projections on the side facing the peel-off film such that the projections are embedded in the uncured resin body when the rigid material is disposed on one side of the uncured resin body.

When a single projection or a plurality of projections are embedded in a sealant resin body, detachment of a rigid material from a semiconductor package intermediate can be prevented when the intermediate is deformed in the reflow soldering step. Accordingly, rigidity can be securely imparted to the entire intermediate with the use of the rigid material in the step of solder layer formation. This ensures inhibition of excessive thermal deformation of the entire intermediate on the substrate.

Further, it is desirable for the rigid material removed in the third step to be reused for manufacturing of another semiconductor device.

After completion of the third step, the rigid material can be readily removed from the sealant resin body via the peel-off film without causing damage to the adhesive face thereof. Therefore, the removed rigid material can be directly reused for manufacturing of another semiconductor device.

Hence, high-yield manufacturing of a high-quality semiconductor device can be realized at lower cost by inhibiting the thermal deformation of the entire semiconductor package with the use of the above rigid material and reusing such rigid material.

Effects of Invention

As is understood based on the above descriptions, according to the semiconductor device manufacturing method of the present invention, a rigid material that makes the rigidity and thermal expansion coefficient of the entire semiconductor package approximately equal to those of the substrate is used during manufacturing and particularly during production of a semiconductor package without any structural change or modification of a semiconductor device itself. As a result of such improvement of the production process in a very simple manner, problems related to damage to a solder layer or the like in a high-temperature atmosphere upon reflow soldering for joining a semiconductor package and a substrate can be effectively solved without any increase of manufacturing cost.

DESCRIPTION OF SYMBOLS

1: Semiconductor element; 21: Die-bonding layer; 22: Lead; 3: Heat dissipating pad; 4: Electrode (external electrode); 5: Sealant resin body; 5': Uncured resin body; 6: Peel-off film; 7: Rigid material; 71: Projection; 10: Semiconductor package intermediate; 10A: Semiconductor package; 20: Substrate; 30: Solder layer

DESCRIPTION OF EMBODIMENTS

Embodiments of the present invention are described below with reference to the drawings. In addition, needless to say, the semiconductor device shown in each figure, the shapes of longitudinal sections of members constituting each device, the positions of semiconductor elements, electrodes, and the like are not limited to the examples in the drawings. Further, a semiconductor device may be accommodated in an exterior case.

Figure 1:
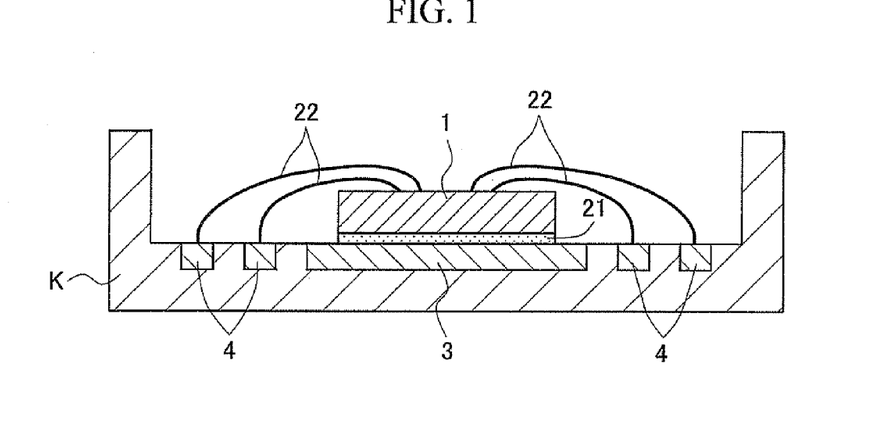
FIG. 1 schematically illustrates a first step of the semiconductor device manufacturing method of the present invention.
Figure 2:
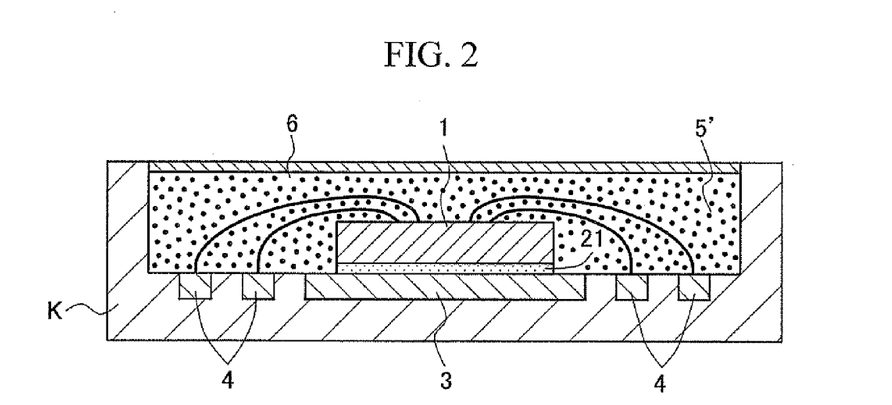
FIG. 2 schematically illustrates the first step (continued from FIG. 1).
Figure 3:
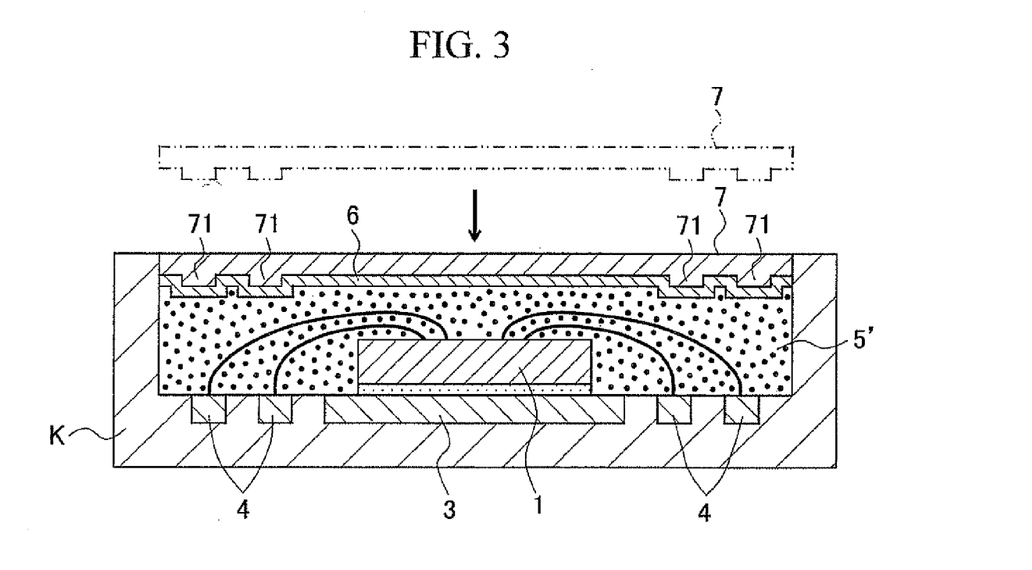
FIG. 3 schematically illustrates the first step (continued from FIG. 2).
Figure 4:
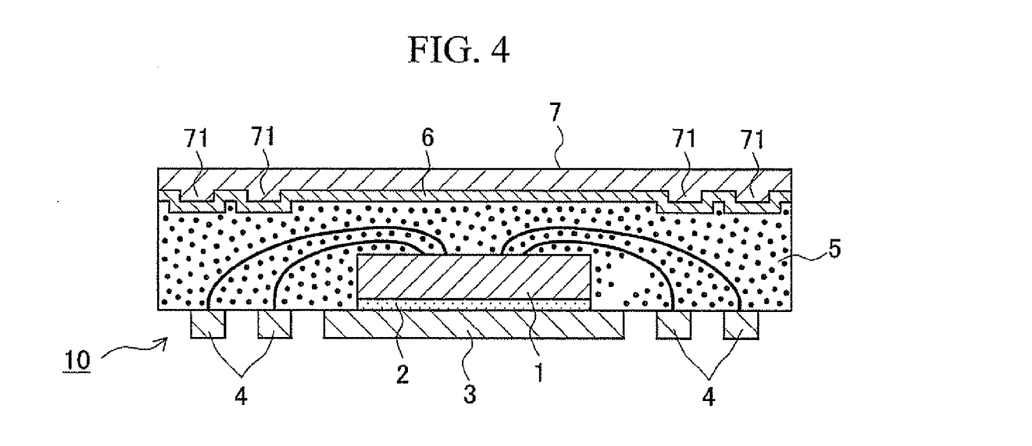
FIG. 4 schematically illustrates a semiconductor package intermediate produced in the first step.
Figure 5:
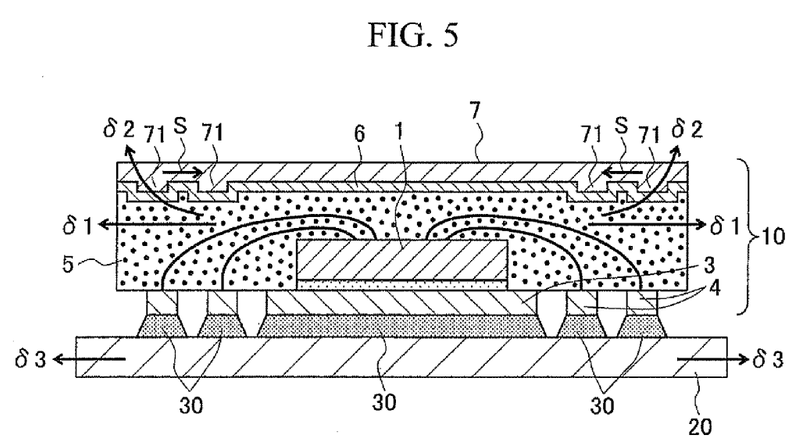
FIG. 5 schematically illustrates the second step of the semiconductor device manufacturing method of the present invention.
Figure 6:
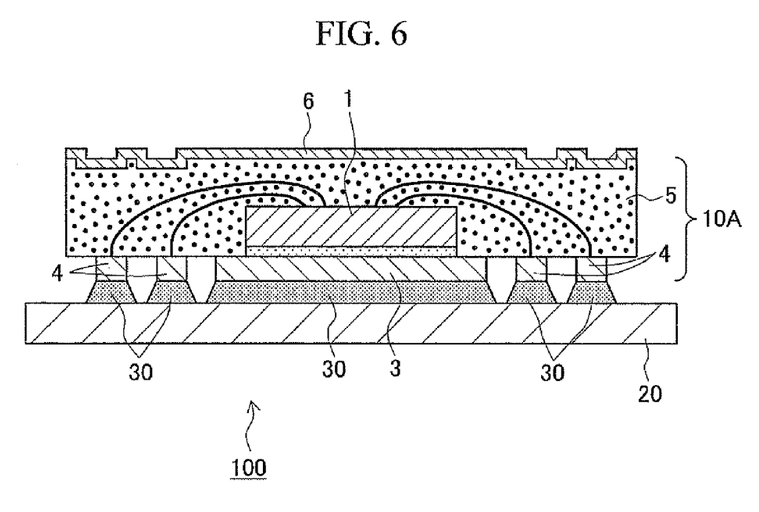
FIG. 6 schematically illustrates the third step of the semiconductor device manufacturing method of present invention and one embodiment of the manufactured semiconductor device.

FIGS. 1 to 3 schematically illustrate the flow of the first step of the semiconductor device manufacturing method of the present invention. FIG. 4 schematically illustrates a semiconductor package intermediate manufactured in the first step. In addition, FIG. 5 schematically illustrates the second step of the semiconductor device manufacturing method of the present invention. FIG. 6 schematically illustrates the third step of the semiconductor device manufacturing method of the present invention and one embodiment of a semiconductor device manufactured in the third step.

First, as shown in FIG. 1, a forming die "K" having an inner space with a size corresponding to the outer size of a sealant resin body that is to be formed is prepared. A heat dissipating pad 3, a semiconductor element 1 that is mounted on the heat-dissipating pad, and electrodes 4 are accommodated in the forming die "K."

Here, for example, a semiconductor element 1 comprising a silicon chip or the like is affixed to a heat dissipating pad 3 consisting of, for example, copper or copper alloy via a die-bonding layer 21 consisting of an electrically conductive adhesive. The semiconductor element 1 and the electrodes 4 are electrically connected to each other via leads 22. They may be partially or entirely integrated before being accommodated in the forming die "K."

In the example shown in FIG. 1, concave grooves for disposing and accommodating a heat dissipating pad 3 and electrodes 4 are formed on the bottom face of the forming die "K." In this embodiment, the heat dissipating pad 3 and the electrodes 4 are accommodated in the concave grooves. Therefore, when they are accommodated in the concave grooves of the forming die "K," their top faces are level with the bottom face of the forming die. Accordingly, when a sealant resin body is formed in the subsequent step, a semiconductor package is formed such that the entire heat dissipating pad and the entire electrodes project from the bottom face of the sealant resin body. However, it is also possible to form a structure in which the heat dissipating pad and the electrodes are partially allowed to project from the bottom face of the forming die "K" and the projections are embedded in the sealant resin body.

Next, a resin used for a sealant resin body is injected into the forming die "K" to form an uncured resin body 5' as shown in FIG. 2.

Here, a resin used for the sealant resin body is not particularly limited. An example of a resin that can be used is a material consisting of a curing agent and an epoxy compound such as a thermosetting epoxy monomer, epoxy oligomer, or epoxy prepolymer.

After an uncured resin body 5' used for a sealant resin body is formed, a peel-off film 6 is applied to the upper face thereof; that is to say, one side of the uncured resin body 5' opposite from the side facing the heat dissipating pad 3, prior to curing of the resin.

Here, the peel-off film 6 is not particularly limited as long as it consists of a material that is detachable from a rigid material disposed on one side of the peel-off film in the subsequent step or a material having excellent detachability. However, for example, the peel-off film 6 may be formed with film, tape, a sheet, or the like made of a resin material. Examples of a resin material that can be used include a fluorine resin, polyester, polypropylene, polyamide, polyamide-imide, and any of such examples surface-coated with a fluorine resin.

Next, the peel-off film 6 is provided to one side of the uncured resin body 5'. As shown in FIG. 3, a rigid material 7 on one side of which projections 71 are formed at predetermined positions is provided on the surface of the peel-off film 6 prior to the curing of the uncured resin body 5'. The rigid material 7 is pushed so as to embed the projections 71 in the uncured resin body 5'. Thus, the uncured resin body 5', the peel-off film 6, and the rigid material 7 are integrated.

Here, the rigid material 7 diposed on one side of the uncured resin body 5' via the peel-off film 6 is not particularly limited in terms of, for example, starting material, shape, or size. However, an appropriate example of the rigid material 7 that can be used is characterized by starting material, shape, or size that allows prevention of excessive deformation of or warpage in a semiconductor package (or semiconductor package intermediate) compared with deformation of or warpage in a substrate at least during reflow soldering of the material and the substrate in the subsequent step. For example, a material having a degree of rigidity (or Young's modulus) and a thermal expansion coefficient comparable to those of a substrate or a material used for a substrate can be used. Further, a material having a thermal expansion coefficient comparable to that of a substrate or a material having a higher degree of rigidity (or Young's modulus) than a substrate can be used. Examples of a material with which the rigid material 7 can be formed include ceramics such as alumina; iron, steel, or aluminum and alloys thereof; and glass epoxy.

When the uncured resin body 5' is cured, a sealant resin body 5 is formed, resulting in integration of the semiconductor element 1, the heat dissipating pad 3, the electrode 4, the peel-off film 6, and the rigid material 7 with the sealant resin body 5. Thus, a semiconductor package intermediate 10 is formed (in the first step). In addition, FIG. 4 illustrates a semiconductor package intermediate 10 removed from the forming die "K."

After the semiconductor package intermediate 10 is prepared, the heat dissipating pad 3, the electrodes 4, and the substrate 20 that constitute the intermediate 10 are joined to each other via reflow soldering.

Herein, the substrate 20 (i.e., a circuit substrate or a wiring substrate) comprises glass epoxy, a ceramic such as alumina or zirconia, or the like, In general, the rigidity (Young's modulus) thereof is higher than that of the sealant resin body 5. The thermal expansion coefficient thereof is lower than that of the sealant resin body 5.

A solder paste (including ball solder, etc.) is applied to predetermined sites on the substrate 20 or to the electrodes 4 or the heat dissipating pad 3, followed by melt solidification (curing) of the solder paste in a furnace at a controlled temperature of approximately 200 degrees C. to 230 degrees C. Thus, as shown in FIG. 5, the semiconductor package intermediate 10 and the substrate 20 are joined to each other via a solder layer 30 (the second step).

In the second step (that is to say, when reflow soldering is carried out in a high-temperature atmosphere), the thermal deformation amount $\delta 1$ of the entire semiconductor package intermediate 10 in the absence of the rigid material 7 is relatively greater than the thermal deformation amount $\delta 3$ of the substrate 20 as shown in FIG. 5. In this case, a deformation mode in which edges of the semiconductor package intermediate 10 roll back against the substrate 20 (degree of warpage: $\delta 2$) is observed.

The above is explained as follows. When the sealant resin body 5 comprises an epoxy resin that is a general forming material and the substrate 20 comprises a glass epoxy resin, the thermal expansion coefficient of an epoxy resin is approximately 60 ppm/K and the Young's modulus, which is a determinant of rigidity, is approximately 3 to 4 GPa, while the thermal expansion coefficient of the glass epoxy resin is approximately 10 ppm/K and the Young's modulus thereof is approximately 20 GPa.

Also in a case in which a forming material for the sealant resin body 5 and that for the substrate 20 are changed, there are no significant changes in the tendency of increase or decrease in thermal expansion coefficient or Young's modulus, in general.

If thermal deformation of the semiconductor package intermediate 10 takes place to a relatively greater extent compared with the substrate 20 and thus the semiconductor package intermediate 10 rolls back to a significant extent against the substrate 20, excessive shear force exceeding resistance (e.g., shear resistance or tensile resistance) of the solder layer 30 acts on the solder layer 30 joining the substrate 20 and the semiconductor package intermediate 10. This might cause crack formation, detachment, or the like.

In order to cope with the above phenomenon, the rigid material 7 that is provided to impart rigidity to the entire intermediate 10 and enables prevention of excessive thermal deformation of the sealant resin body 5 is dispsosed on the upper face of the semiconductor package intermediate 10 shown in FIG. 5 (i.e., one side of the sealant resin body 5 opposite from the side facing the substrate 20). Thus, when thermal deformation of the sealant resin body 5 takes place, shear force S or the like can be applied to the sealant resin body 5 in the direction opposite from the direction of thermal deformation. As a result, the thermal deformation amount $\delta 1$ and the degree of warpage $\delta 2$ of the sealant resin body 5 can be reduced, allowing control of tensile force, shear force, and the like acting on the solder layer 30 without causing detachment or crack formation.

In addition, the rigid material 7 shown in FIG. 5 has projections 71 embedded in the sealant resin body 5. The projections function as shear keys such that detachment of the rigid material 7 from the sealant resin body 5 can be effectively prevented.

When the solder layer 30 is formed, an integrated unit of the semiconductor package 10 and the substrate 20 is cooled to inhibit thermal deformation of the entire unit. In addition, in a phase in which ordinary temperature is achieved after thermal contraction, the rigid material 7 is removed from the sealant resin body 5. Then, a semiconductor device 100 is manufactured when a semiconductor package 10A is formed (with a package configuration in the absence of the rigid material 7) as shown in FIG. 6.

Since the rigid material 7 is attached indirectly (not directly) to the sealant resin body 5 via the peel-off film 6, the rigid material 7 can be detached very smoothly without causing damage to the attachment face of the rigid material 7.

Further, the removed rigid material 7 is reused to manufacture another semiconductor device. Therefore, the rigid material 7 can be efficiently used during its duration period.

As described above, a rigid material that is provided to impart rigidity to the entire semiconductor package and enables inhibition of excessive thermal deformation of a sealant resin body is disposed, and then reflow soldering of the semiconductor package (semiconductor package intermediate) and the substrate is carried out during the semiconductor device manufacturing process. Thus, detachment or damage such as crack formation between constituent members (such as a solder layer) of a semiconductor device can be effectively prevented, making it possible to manufacture a semiconductor device with excellent product quality. In addition, the rigid material is inexpensive and can be reused. This contributes to manufacturing cost reduction.

Embodiments of the present invention are described above in detail with reference to the drawings. However, the specific configuration of the present invention is not limited thereto. Various changes and modifications to the present invention can be made equally without departing from the spirit or scope thereof.

The invention claimed is:

1. A method for manufacturing a semiconductor device by forming a semiconductor package with a heat dissipating pad, a semiconductor element mounted on the heat dissipating pad, electrodes disposed at a distance from the heat dissipating pad and electrically connected to the semiconductor element, and a sealant resin body for sealing at least the semiconductor element and joining the heat dissipating pad and the electrodes separately to a substrate via a solder layer, which comprises:
    a first step of producing a semiconductor package intermediate by injecting a resin used for the sealant resin body into a forming die in which the electrodes, the heat dissipating pad, and the semiconductor element are disposed, providing a peel-off film on one side of the resin in the form of a still-uncured resin body opposite from the other side facing the heat dissipating pad and a rigid material on one side of the peel-off film opposite from the other side facing the uncured resin body, and curing the uncured resin body to form the sealant resin body;
    a second step of forming the solder layer by reflow soldering between the substrate and each of the heat dissipating pad and the electrodes that constitute the semiconductor package intermediate removed from the forming die in the first step; and
    a third step of removing the rigid material from the peel-off film, and wherein the rigid material is integrated into the semiconductor package intermediate so as to make the thermal expansion coefficient and rigidity of the semiconductor package intermediate approximately equal to those of the substrate.

2. The semiconductor device manufacturing method according to claim 1, wherein the thermal expansion amount of the semiconductor package intermediate and that of the substrate are made approximately equal to each other in a high-temperature atmosphere during reflow soldering.

3. The semiconductor device manufacturing method according to claim 1, wherein projections are formed on one side of the rigid material facing the peel-off film so as to allow the projections to be embedded in the uncured resin body when the rigid material is disposed on one side of the uncured resin body.

4. The semiconductor device manufacturing method according to claim 1, wherein the rigid material removed in the third step is reused to produce another semiconductor device.

5. The semiconductor device manufacturing method according to claim 2, wherein projections are formed on one side of the rigid material facing the peel-off film so as to allow the projections to be embedded in the uncured resin body when the rigid material is disposed on one side of the uncured resin body.

6. The semiconductor device manufacturing method according to claim 2, wherein the rigid material removed in the third step is reused to produce another semiconductor device.

7. The semiconductor device manufacturing method according to claim 3, wherein the rigid material removed in the third step is reused to produce another semiconductor device.

8. The semiconductor device manufacturing method according to claim 5, wherein the rigid material removed in the third step is reused to produce another semiconductor device.

* * * * *